(12) United States Patent
Alsaleem et al.

(10) Patent No.: US 10,771,040 B2
(45) Date of Patent: Sep. 8, 2020

(54) SYSTEMS AND METHODS FOR REDUCING THE ACTUATION VOLTAGE FOR ELECTROSTATIC MEMS DEVICES

(71) Applicant: NUtech Ventures, Lincoln, NE (US)

(72) Inventors: Fadi Alsaleem, Omaha, NE (US); Mohammad H. Hasan, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 16/033,573

(22) Filed: Jul. 12, 2018

(65) Prior Publication Data

US 2019/0020326 A1   Jan. 17, 2019

Related U.S. Application Data

(60) Provisional application No. 62/531,803, filed on Jul. 12, 2017.

(51) Int. Cl.

| H03H 9/24 | (2006.01) |
|---|---|
| H03H 9/02 | (2006.01) |
| B81B 7/02 | (2006.01) |
| G02B 6/35 | (2006.01) |
| H03H 3/007 | (2006.01) |
| B81B 3/00 | (2006.01) |

(52) U.S. Cl.
CPC ....... *H03H 9/02259* (2013.01); *B81B 3/0086* (2013.01); *B81B 7/02* (2013.01); *G02B 6/357* (2013.01); *H03H 3/0073* (2013.01); *H03H 9/2463* (2013.01); *H03H 2009/02283* (2013.01)

(58) Field of Classification Search
CPC . H03H 9/00; H03H 9/125; H03H 9/24; H03B 5/30; B81B 7/02
USPC .......................................... 331/154; 333/186
See application file for complete search history.

(56) References Cited

U.S. PATENT DOCUMENTS

| 5,839,062 | A | * | 11/1998 | Nguyen | ............. | H03H 9/02377 |
|---|---|---|---|---|---|---|
| | | | | | | 455/323 |
| 8,493,157 | B2 | * | 7/2013 | Steeneken | ................ | H03D 7/00 |
| | | | | | | 310/365 |
| 9,032,795 | B2 | * | 5/2015 | Lim | .................... | G01C 19/5783 |
| | | | | | | 73/504.12 |
| 2018/0299581 | A1 | * | 10/2018 | Gunawan | ................ | G01V 7/06 |

* cited by examiner

*Primary Examiner* — Dean O Takaoka
(74) *Attorney, Agent, or Firm* — Leydig, Voit & Mayer, Ltd.; Gerald T. Gray

(57) ABSTRACT

Systems and methods to amplify the response of a MEMS micro-oscillator by driving the MEMS device at its electrical and mechanical resonance frequencies, simultaneously. This enhances the MEMS mechanical sensitivity to electrical excitation and increases the voltage across the MEMS capacitor. Moreover, using a combination of two input signals at different frequencies (beat signal) may be used to achieve double resonance in any MEMS device, even if its natural frequency is far from its electrical resonance.

7 Claims, 12 Drawing Sheets

SYSTEMS AND METHODS FOR REDUCING THE ACTUATION VOLTAGE FOR ELECTROSTATIC MEMS DEVICES

CROSS-REFERENCE TO RELATED APPLICATIONS

The present application claims the benefit under 35 U.S.C. § 119(e) of U.S. Provisional Application Ser. No. 62/531,803, filed Jul. 12, 2017, and titled "SYSTEMS AND METHODS FOR REDUCING THE ACTUATION VOLTAGE FOR ELECTROSTATIC MEMS DEVICES," which is hereby incorporated by reference in its entirety.

BACKGROUND

Micro-electro-mechanical-systems (MEMS) have received great attention due to their great potential and unique characteristics. A MEMS (also termed MEMS device herein) is inexpensive for mass production, is small, fast, highly sensitive, has low noise-sensitivity, and requires a small amount of power, especially when they are actuated electrostatically. This is the most common way to actuate a MEMS device. Even though this actuation method consumes very low power, compared to other actuation methods, an electrostatic MEMS device requires very high voltage to move its structure. This need is one of the major challenges limiting the adoption of electrostatic MEMS in very promising applications such as RF switches and MEMS resonator-based sensors. Therefore, there has been an increasing interest in reducing the electrostatic MEMS input voltage. Reducing the air gap between the MEMS structure and the substrate, increasing the electrostatic actuation area, or reducing the MEMS stiffness, are just few methods that were proposed in the prior art to reduce the actuation voltage for electrostatic MEMS. However, most of these methods limit the operation of the MEMS and could be a source for other problems. For example, reducing the air gap or increasing the MEMS actuation area will increase the undesirable effect of squeeze-film-damping. Moreover, decreasing the MEMS stiffness reduces the MEMS immunity to stiction.

SUMMARY

Embodiments herein provide novel methods to amplify the effect of the electrostatic input voltage by triggering the MEMS electrical circuit resonance. The methods advantageously impose no restriction on the MEMS operation, nor do the methods require a device configuration or design change.

According to an embodiment, a method is provided for actuating an electrostatic micro-electro-mechanical system (MEMS) micro-oscillator device, wherein the MEMS device has a natural mechanical resonance frequency and an internal electrical resonance frequency. The method typically includes driving the MEMS device with a first alternating current (AC) signal, and simultaneously driving the MEMS device with a second AC signal, wherein a frequency of the first AC signal is within the bandwidth of the internal electrical resonance frequency (within the 3-db bandwidth of the internal electrical resonance frequency) and wherein a difference between the frequency of the first AC signal and a frequency of the second AC signal is near to or substantially the same as the natural mechanical resonance frequency (e.g., within about 5% to 10%). In certain aspects, the MEMS oscillator device includes an electrode arrangement comprising a first electrode and a second electrode arranged parallel to the first electrode, wherein the second electrode is fixed and wherein at least a first end of the first electrode is able to move relative to the second electrode. In certain aspects, the natural mechanical resonance frequency $\omega_n = \sqrt{(k/m)}$, and the internal electrical resonance frequency $\omega_e = 1/\sqrt{(L_s C_o)}$, wherein $L_s$ is the parasitic inductance of the electrode arrangement, $C_o$ is a nominal capacitance of the electrode arrangement, wherein m is an effective mass of the first electrode and k is a linear stiffness of the first electrode. In certain aspects, the method further includes applying a direct current (DC) signal to the first electrode.

According to another embodiment, a method is provided for actuating an electrostatic micro-electro-mechanical system (MEMS) micro-oscillator device, wherein the MEMS device has a natural mechanical resonance frequency that is near to or substantially the same as an internal electrical resonance frequency of the MEMS device. The method typically includes driving the MEMS device with a first alternating current (AC) signal, wherein a frequency of the first AC signal is near to or substantially the same as the internal electrical resonance frequency or the natural mechanical resonance frequency (e.g., within about 5% to 10%).

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

DETAILED DESCRIPTION

The following detailed description is exemplary in nature and is not intended to limit the invention or the application and uses of the invention. Furthermore, there is no intention to be bound by any expressed or implied theory presented in the following detailed description or the appended drawings.

Turning to the drawings, and as described in detail herein, embodiments of the disclosure provide methods, devices and systems useful to actuate a MEMS device.

Figure 1:
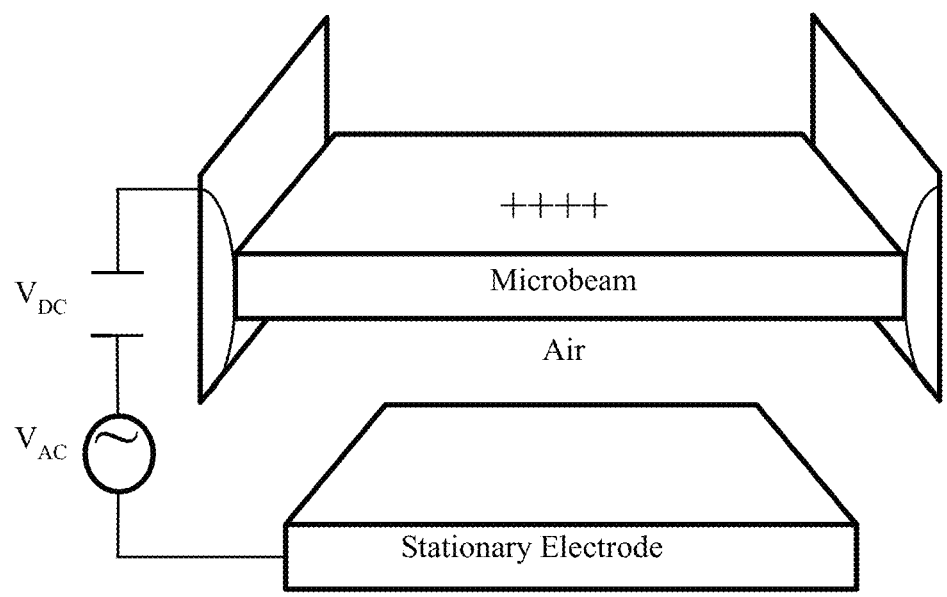
FIG. 1 shows a typical configuration of a clamped-clamped parallel plate electrostatic MEMS device.

Parallel-plate electrostatic force is the common actuation method in MEMS. A typical configuration is represented in FIG. 1 for a clamped-clamped micro-beam. Two modes of operation can be utilized using this configuration—the capacitive and the dynamic forcing modes.

In the capacitive mode, an applied small alternating current (AC) voltage, $V_{AC}$, is used to measure changes in the MEMS effective capacitance due to a condition of interest, such as water vapor (humidity). In the dynamic forcing mode, or dynamics mode, the movable structure (upper electrode) is usually biased by an electrostatic direct current (DC) and AC load. The DC voltage, $V_{DC}$, deflects the upper (movable) electrode slightly and $V_{AC}$ vibrates the electrode around the new, deflected position. Usually, the AC frequency is chosen such that it drives the MEMS microstructure at mechanical resonance, such as in resonant sensors. The large mechanical vibration of the MEMS at resonance provides higher sensitivity and better noise rejection compared to the static mode.

Capacitive Mode

An ideal typical capacitive MEMS device includes two electrically isolated parallel plates. The two parallel plates create an electrical capacitor with a nominal capacitance $C_o$ (F) given by:

$$C_o = \frac{\varepsilon_o \varepsilon_r A}{d} \quad (1)$$

where A is the overlapping area of the parallel plates, $\varepsilon_o$ is the electric constant of the vacuum, and $\varepsilon_r$ is the relative permittivity of the medium between the two plates. However, the internal connections in a physical capacitor always produces a parasitic inductor $L_s$ (H), which is usually ignored at low excitation frequency. At high excitation frequencies, below the MEMS circuit resonance frequency, the effective capacitance $C_E$ of the MEMS circuit, described in equation (2), is always higher than the nominal capacitance $C_o$:

$$C_E = \frac{C_o}{(1 - \omega^2 L_s C_o)} \quad (2)$$

where $\omega$ is the excitation frequency of the AC voltage (rad/s).

Figure 2:
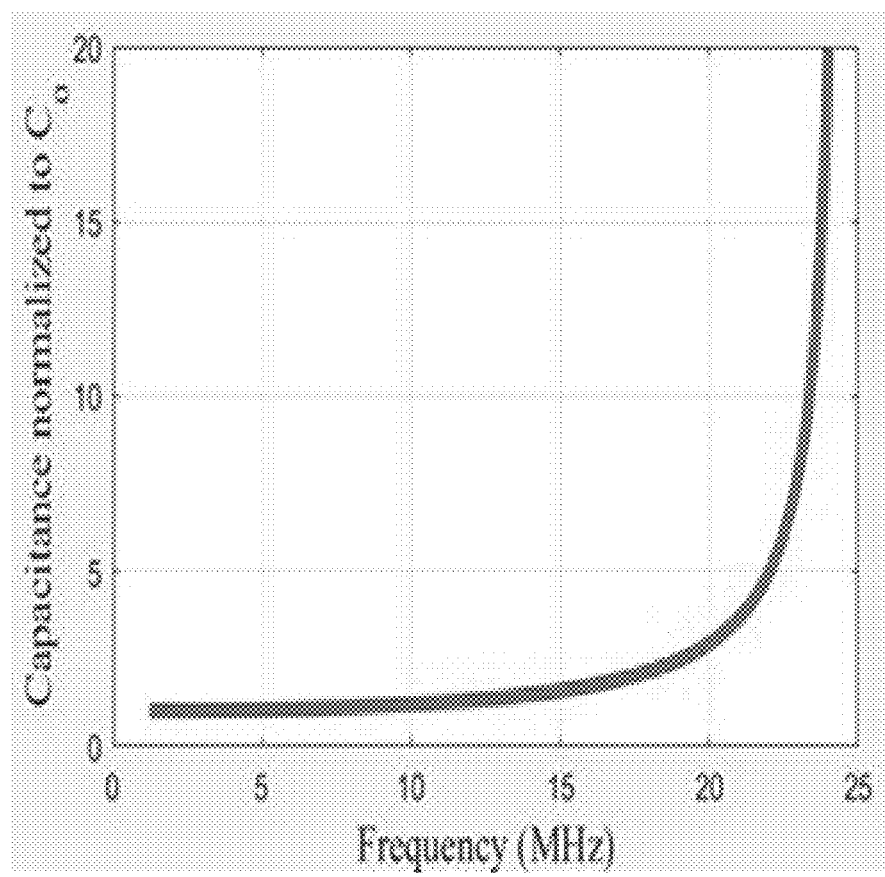
FIG. 2 shows the change in capacitance of a MEMS device due to frequency and parasitic inductance.

Simulation for the capacitance amplification is shown in FIG. 2 for a MEMS device that will be introduced below. FIG. 2 shows that the MEMS effective capacitance reaches very high values as the AC excitation frequency is increased such that $\omega$ approaches $1/\sqrt{L_s C_o}$, the MEMS internal electrical resonance frequency. This large amplification in the MEMS effective capacitance, and hence, its high sensitivity to changes in $\varepsilon_r$, has been recently proposed to detect and measure tiny concentrations of analytes, such as measuring specific protein content in a label-free manner. In certain embodiments, the capacitance amplification, near the MEMS electrical resonance, is used to amplify the effect of the AC input voltage during the dynamics mode, as described herein.

Dynamics Mode

As stated above, the dynamics excitation of an electrostatic MEMS device is accomplished by suppling DC and AC voltages. However, a large voltage is usually required to vibrate the device. This high actuation voltage requirement for electrostatic MEMS devices is the most significant disadvantage of electrostatic actuation compared to other actuation methods, such as piezo-electric and electromagnetics actuation. Even with this limitation, electrostatic actuation is the most common actuation method used in MEMS applications. According to an embodiment, double resonance (mechanical and electrical resonance) is used to eliminate the need for high input voltage actuation.

Figure 3:
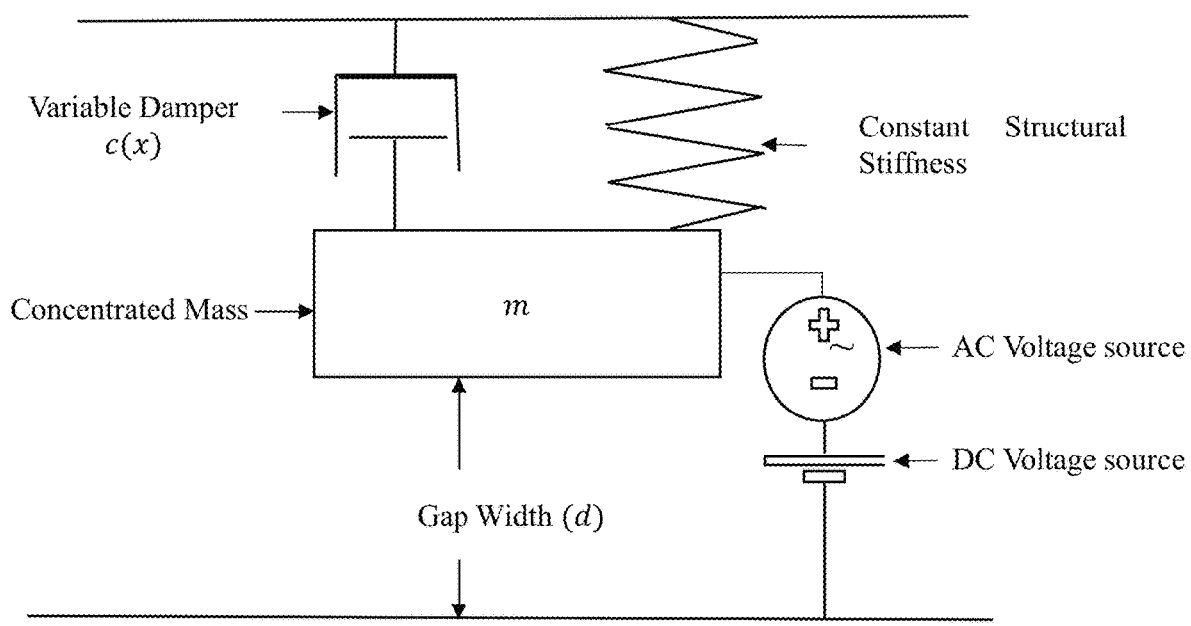
FIG. 3 shows a MEMS single degree of freedom model of a MEMS system according to an embodiment.

In the following example, a single-degree-of-freedom spring-mass-damper system was adapted to model the dynamics of an electrostatic MEMS device, as shown in FIG. 3. The system is electrostatically actuated by a DC voltage signal superimposed with AC voltage. In this model, the MEMS mass is treated as a single point and it can only move in one direction. The equation of motion of the system is given by:

$$m_{eff}\ddot{x}(t) + c(x)\dot{x} + kx = F_e(x, t) \quad (3)$$

where x is the MEMS deflection (m), the dot operators represent temporal derivatives, t is the time in seconds, $m_{eff}$ (kg) is the effective mass, given by $m_{eff} = k/\omega_n^2$, $\omega_n$ is the natural frequency of the system (rad/s), k is the linear stiffness of the micro beam (N/m), c(x) is the nonlinear squeeze film damping of the system (Ns/m) given by Blech model, and $F_e(x, t)$ is the electrostatic force (N) that is usually given by:

$$F_e(x, t) = \frac{\varepsilon_o \varepsilon A (V_{DC} + V_{AC}\cos(\omega t))^2}{2(d-x)^2} \quad (4)$$

In equation 4, $V_{DC}$ and $V_{AC}$ are the input DC voltage and input AC voltage amplitude, respectively. Under common actuation conditions, the input AC frequency is much lower than the MEMS electrical resonance frequency ($\omega_e = 1/\sqrt{L_s C_o}$), due to the low parasitic inductor value. Thus, the voltage across the MEMS is assumed equal to the input voltage, as shown in FIG. 3. While MEMS devices are commonly connected to resistors in series as a precaution to pull-in, under high input AC excitation frequencies, a series RLC (Resistor-inductor-capacitor) circuit analysis is required to calculate the voltage across the MEMS capacitor, $V_{ACeff}(x)$. The amplitude of this voltage is calculated by:

$$V_{ACeff}(x) = \frac{V_{AC}}{\left(\sqrt{(\omega R C(x))^2 + (1 - \omega^2 * L * C(x))^2}\right)} \quad (5)$$

where R is the MEMS circuit resistance value, L is the total series inductance of the circuit and equals $L_{external} + L_s$, and C(x) is the MEMS capacitance value which is a function of x given by:

$$C(x) = \frac{\varepsilon A}{(d-x)} \quad (6)$$

Substituting equation (5) into equation (4) then back into equation (3) gives:

$$m\ddot{x} + c(x)\dot{x} + kx = \frac{\varepsilon A}{2(d-x)^2}\left[V_{DC} + \frac{V_{AC}\cos(\omega t)}{\sqrt{(\omega RC(x))^2 + (1-\omega^2 LC(x))^2)}}\right]^2 \quad (7)$$

Equation (7) is a highly coupled equation; the voltage amplification (due to circuit resonance) is a function of the MEMS deflection, x (due to mechanical resonance). The MEMS deflection, x, is a function of the effective voltage. Moreover, for a MEMS circuit with a small R-value (circuit damping), the effective voltage can be amplified by over an order of magnitude of the input voltage, if the frequency is chosen to be near the MEMS electrical circuit resonance. This large voltage amplification can relax the need for the high input voltage to vibrate an electrostatic MEMS device if the MEMS natural mechanical resonance frequency, $\omega_n = \sqrt{(k/m)}$ is also near $\omega_e$. This interesting phenomenon is termed herein as double resonance actuation. This phenomenon can be alternatively achieved for a MEMS device that has a large difference between $\omega_e$ and $\omega_n$ (as is the case for the MEMS device discussed in the following section) by exciting the MEMS device with two different AC sources of frequency $\omega_1$ and $\omega_2$. To produce the double resonance amplification, at least one of the excitation signal frequencies should be near $\omega_e$, and the absolute difference $\Delta\omega = |\omega_1 - \omega_2|$ should be near $\omega_n$.

This special arrangement for double resonance activation is explained as follows. First, assume the $AC_1$ signal has a frequency of $\omega_1$ that is near $\omega_e$ and the difference between the two AC signal frequencies, $\Delta\omega = |\omega_1 - \omega_2|$ is close to the mechanical resonance of the MEMS $\omega_n$. The DC term (i.e. there is no applied DC voltage) is dropped to simplify the analysis. Using the circuit superposition principle, equation (5) can be used to calculate the effective voltage for each signal separately. The AC signal with frequency $\omega_1$ will produce a voltage amplification given by equation (5).

The second voltage signal may or may not produce voltage amplification. For a typical MEMS device, the mechanical natural frequency $\omega_n$ is high, such that $\Delta\omega$ used is enough to push the frequency of the second AC signal out of the electrical amplification bandwidth, thus $V_{AC2eff} \cong V_{AC2}$. The combined effect of the AC signals on the MEMS dynamics response can be described as:

$$m\ddot{x} + c(x)\dot{x} + kx = \frac{\varepsilon A(V_{AC2}\cos(\omega_2 t) + V_{ACeff1}(x)(\omega_1 t))^2}{2(d-x)^2} \quad (8)$$

Expanding the voltage square term in (8) results in:

$(V_{AC2}\cos(\omega_2 t) + V_{ACeff1}(x)(\omega_1 t))^2 =$ $V_{ACeff1}^2 \cos^2(\omega_1 t) + V_{AC2}^2 \cos^2(\omega_2 t)$ $+ V_{ACeff1}V_{AC2}(\cos(\omega_1+\omega_2) + \cos(\omega_1-\omega_2)) \quad (9)$ The term $V_{ACeff1}V_{AC2}\cos(\omega_1-\omega_2)$ in equation (9) is the only term that will cause significant mechanical vibration; the difference $\omega_1-\omega_2$ is near the mechanical vibration of the MEMS and $V_{ACeff1}$ is an amplified version of $V_{AC1}$, due to the MEMS internal circuit resonance. Dropping the other terms, equation (9) can be simplified to:

$$m\ddot{x} + c(x)\dot{x} + kx = \frac{\varepsilon A V_{ACeff1} V_{AC2}\cos(\omega_1-\omega_2)}{2(d-x)^2} \quad (10)$$

Equation (10) highlights that the effect of an AC input to a MEMS device can be amplified by over an order of magnitude by driving the MEMS device with two AC signals of frequency difference equal to the MEMS mechanical natural frequency and the frequency of at least one of these signals is near the MEMS internal circuit resonance frequency.

In an embodiment, a method for actuating an electrostatic micro-electro-mechanical system (MEMS) micro-oscillator device includes, in a first step, providing the MEMS device. The MEMS oscillator device may include an electrode arrangement comprising a first electrode and a second electrode arranged parallel to the first electrode, wherein the second electrode is fixed and wherein at least a first end of the first electrode is able to move relative to the second electrode. The MEMS device may be connected to one or more AC sources and a DC source. In a second step, the MEMS device is driven with a first alternating current (AC) signal (e.g., from a first AC source); and simultaneously driven with a second AC signal (e.g., from a second AC source). The frequency of the first AC signal is within the 3-db bandwidth of, or substantially the same as, the internal electrical resonance frequency of the MEMS device and a difference between the frequency of the first AC signal and a frequency of the second AC signal is near to or substantially the same as the natural mechanical resonance frequency of the MEMS device. The natural mechanical resonance frequency $\omega_n = \sqrt{(k/m)}$, and the internal electrical resonance frequency $\omega_e = 1/\sqrt{L_s C_o}$, wherein $L_s$ is the parasitic inductance of the electrode arrangement, wherein $C_o$ is a nominal capacitance of the electrode arrangement, wherein m is an effective mass of the first electrode and wherein k is a linear stiffness of the first electrode. In another step, a direct current (DC) signal is also applied to the first electrode.

In another embodiment, a method for actuating an electrostatic micro-electro-mechanical system (MEMS) micro-oscillator device includes, in a first step, providing the MEMS device. The MEMS oscillator device may include an electrode arrangement comprising a first electrode and a second electrode arranged parallel to the first electrode, wherein the second electrode is fixed and wherein at least a first end of the first electrode is able to move relative to the second electrode. The MEMS device has a natural mechanical resonance frequency that is near to or substantially the same as an internal electrical resonance frequency of the MEMS device. The MEMS device may be connected to an AC source and a DC source. In a second step, the MEMS device is driven with a first alternating current (AC) signal, wherein a frequency of the first AC signal is near to or substantially the same as the internal electrical resonance frequency or the natural mechanical resonance frequency. In another step, a direct current (DC) signal is also applied to the first electrode.

Experimental Validation

Figure 4A:
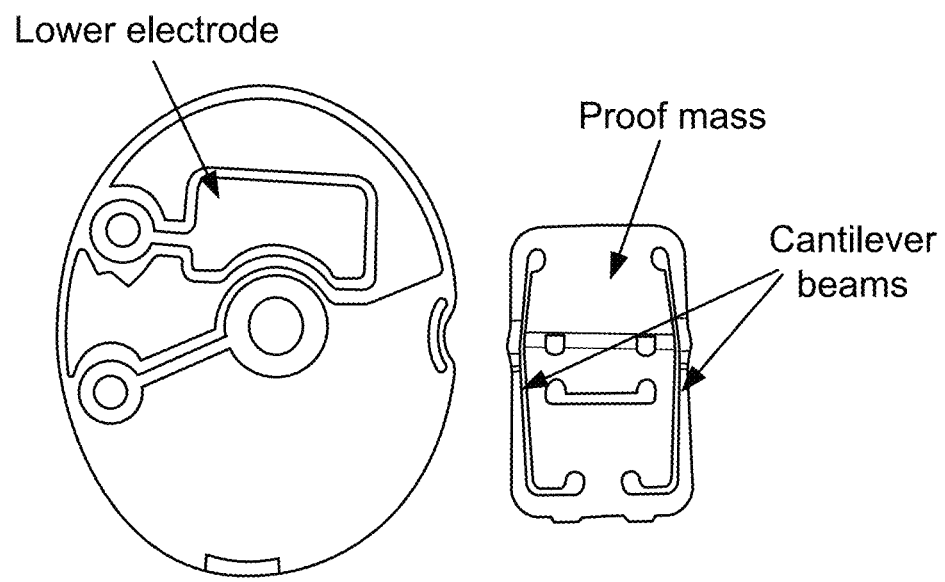
FIG. 4A shows an experimental set-up of the MEMS device and FIG. 4B shows the single degree of freedom model.
Figure 4B:
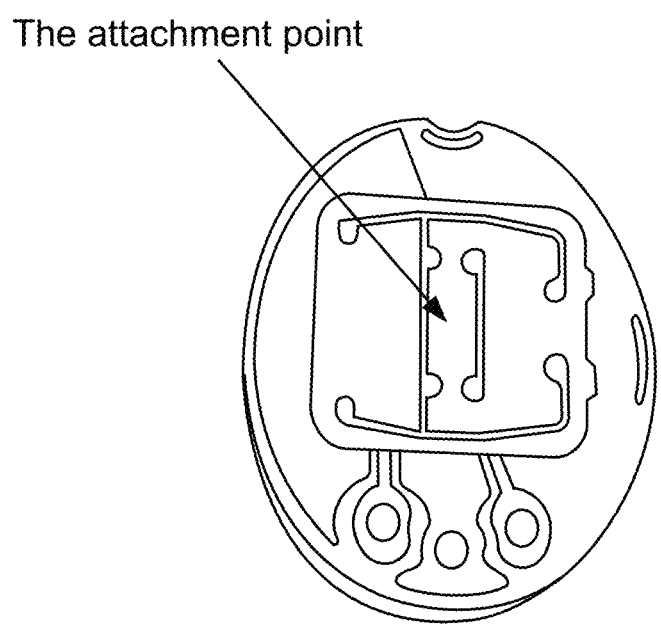

A Sensata™ MEMS accelerometer sensor has been used to validate the voltage amplification. The device is shown in FIG. 4A and is described in detail in Alsaleem, F. M., Younis, M. I., & Ouakad, H. M. (2009), *On the nonlinear resonances and dynamic pull-in of electrostatically actuated* resonators, *Journal of Micromechanics and Microengineering*. The mechanical resonance of the MEMS device was determined to be around 195 Hz using a frequency sweep-method. The device has dimensions of l=9000 μm and b=5320 μm. Due to the size of the MEMS sensor used, it is not possible to achieve an oscillatory response at high pressure. Therefore, the experiment was carried out at reduced pressure of 8 Pa using a vacuum chamber. The MEMS was driven using a Lyncee Tec stroboscopic module and its deflection was measured using Lyncee Tec's DHM (Digital Holographic Microscope). The DHM measures the out-of-plane motion using the principle of light interference. Knowing the frequency of the MEMS output, the DHM synchronizes rapid, narrow laser pulses at the output frequency of the microbeam to take still images of the microbeam at a fixed location. This allows the DHM's camera to take a nearly still picture of the microbeam at each frame. After n frames, the DHM measures a complete cycle of oscillation. These post-processing steps are performed using a stroboscopic module installed in a mainframe. Moreover, the MEMS capacitor is connected to a LabVIEW data acquisition card to monitor its voltage.

It was found experimentally that the internal circuit resonance of the MEMS is far from its mechanical resonance and from the MEMS analyzer sampling frequency capability (1 Hz-25 MHz). To tune the circuit resonance of the MEMS, an external inductor $L_{external}$=27 mH was added in parallel to the MEMS device. The added inductor shifts the MEMS electrical resonance to be around 63.4 kHz. A resistor of 470Ω was added in series to prevent the flow of large current in the circuit while still exciting the MEMS near the circuit resonance frequency.

Figure 5:
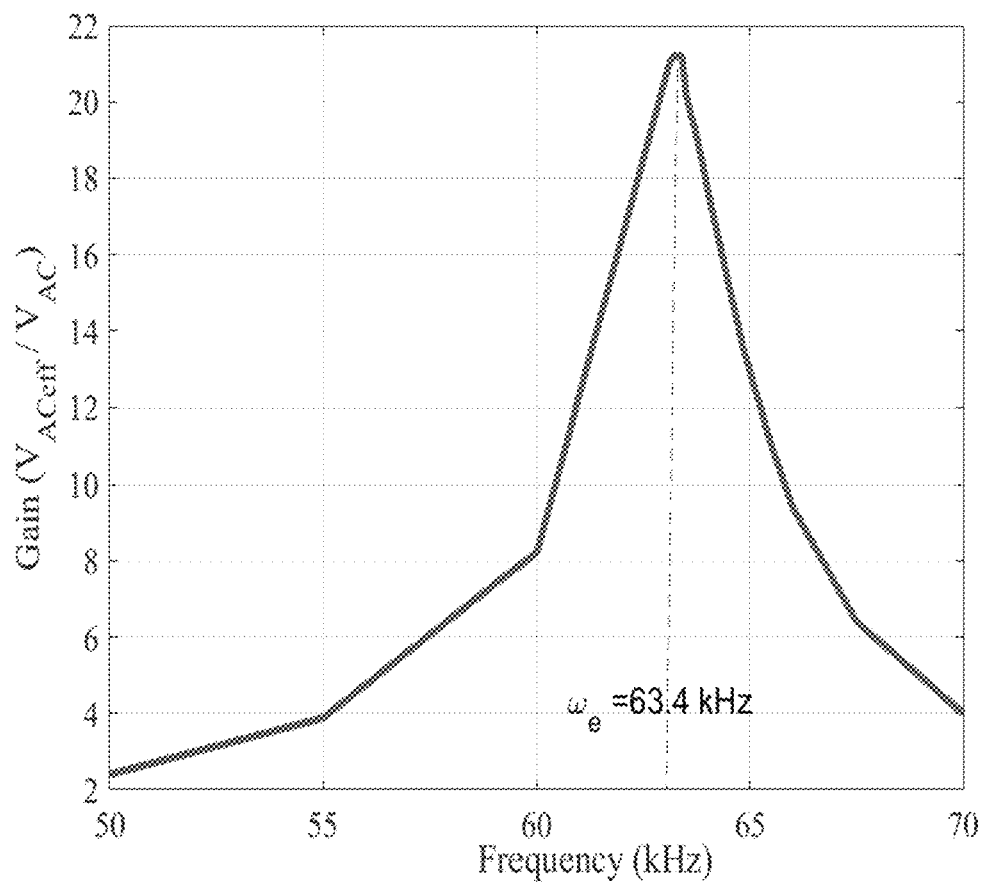
FIG. 5 shows the measured amplification (gain) for the voltage across the MEMS with respect to the input voltage as a function of the AC frequency, according to an embodiment.

Using the experimental set-up described above, an experiment was conducted to confirm the voltage amplification across the MEMS device due to an RLC circuit resonance effect. In this experiment, a small signal with a frequency near the MEMS circuit resonance frequency was supplied. Next, the frequency of the input signal was slowly swept while measuring the voltage across the MEMS using the LabVIEW acquisition card. FIG. 5 shows the measured amplification (gain) for the voltage across the MEMS with respect to the input voltage. It is clear from FIG. 5 that a voltage amplification of up to 21 times can be achieved by supplying an AC signal with a frequency near the MEMS circuit resonance. If desirable, a higher amplification can be achieved using a smaller resistor value.

Figure 6:
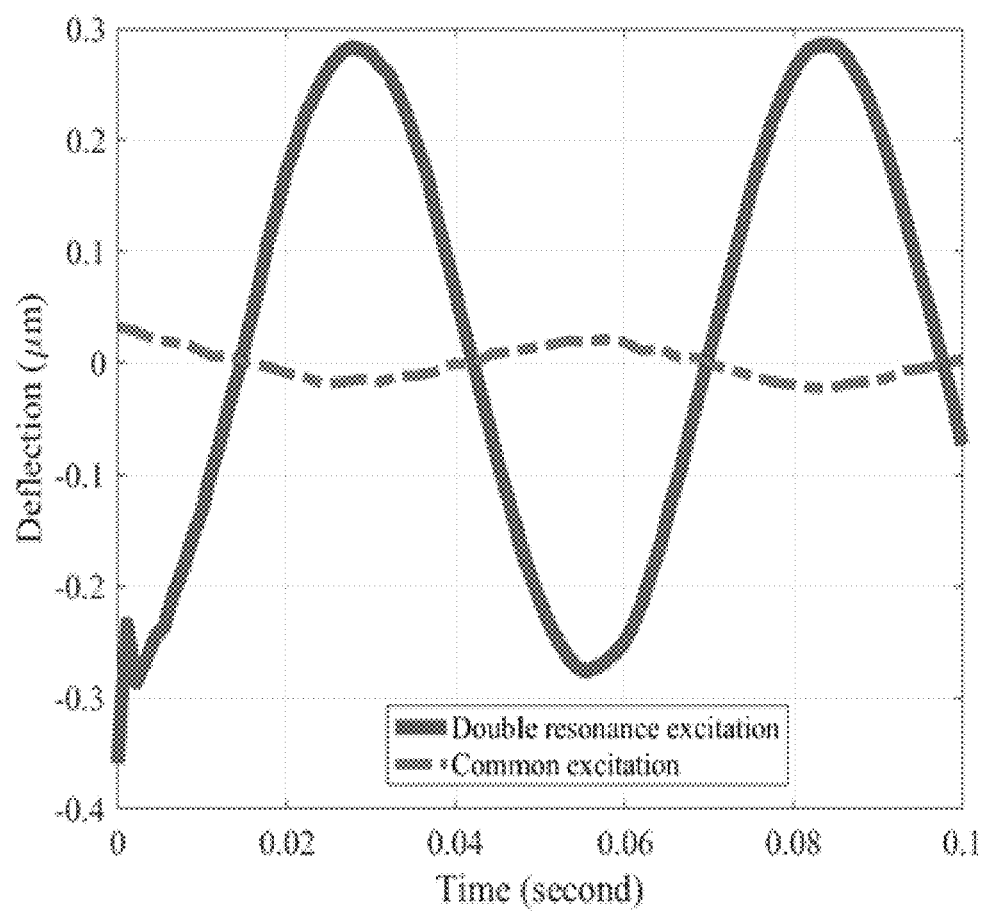
FIG. 6 shows the experimental time history for the MEMS deflection for AC signals with and without double resonance amplification, according to embodiments.

Next, an experiment was conducted to quantify the effect of double resonance voltage amplification on the MEMS mechanical vibration. In this experiment, the MEMS device was supplied with a single AC signal of frequency=190 Hz (near the MEMS natural mechanical resonance frequency). The signal has an amplitude of 2V. Next, the MEMS was supplied with two AC signals, each with amplitude of only 1V. The first signal has a frequency of 60.8 kHz (near the electrical resonance frequency) and the difference between the two signals is 190 Hz (near the mechanical resonance frequency). From FIG. 5, a voltage amplification gain of up to 8 times is expected, due to the double resonance effect. FIG. 6 compares the actual MEMS deflection measured by the DHM MEMS analyzer for the above two cases. The figure clearly shows a large amplification in the MEMS response due to the double resonance effect; even though the total input AC voltage amplitude is equal in both cases.

FIG. 7A, FIG. 7B, FIG. 8A and FIG. 8B show examples of double resonance excitation experimental results.

Figure 7A:
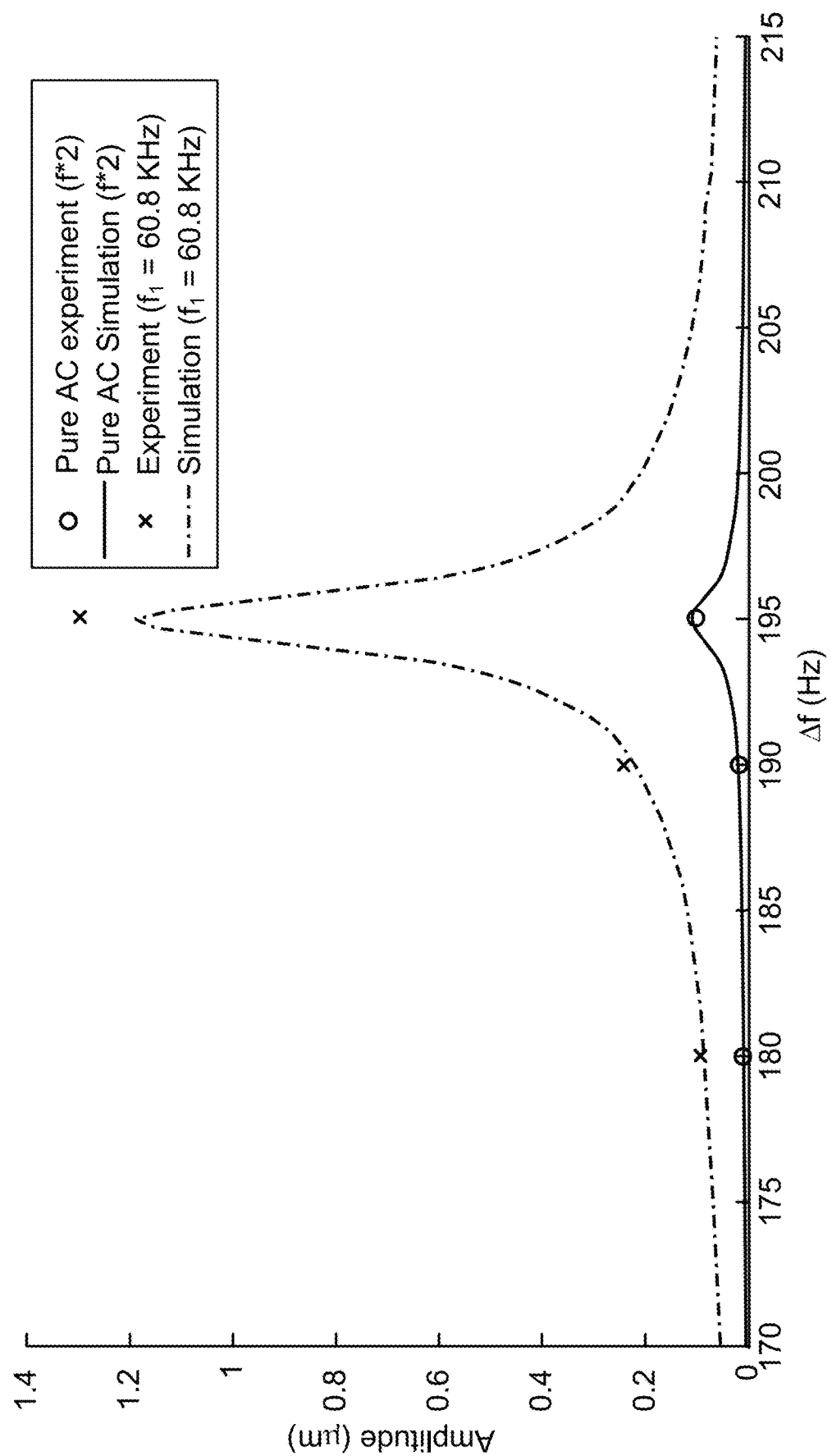
FIG. 7A, FIG. 7B, FIG. 8A and FIG. 8B show examples of double resonance excitation experimental results.
Figure 7B:
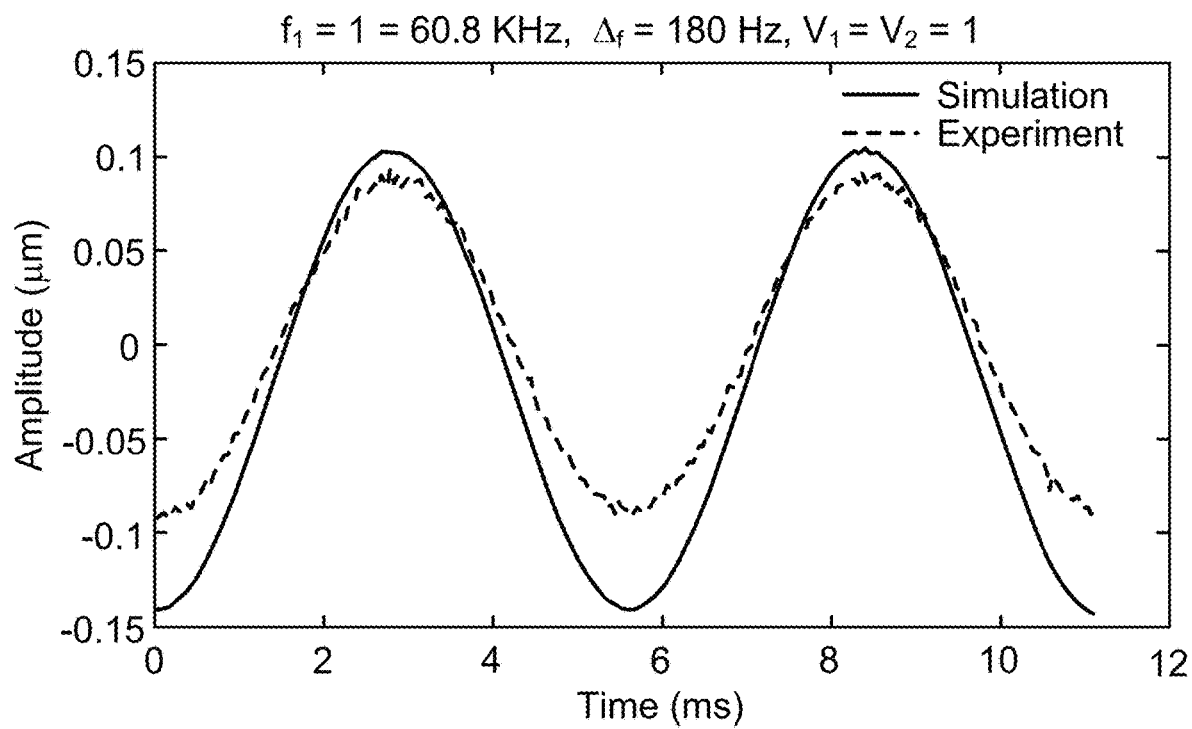
Figure 7B:
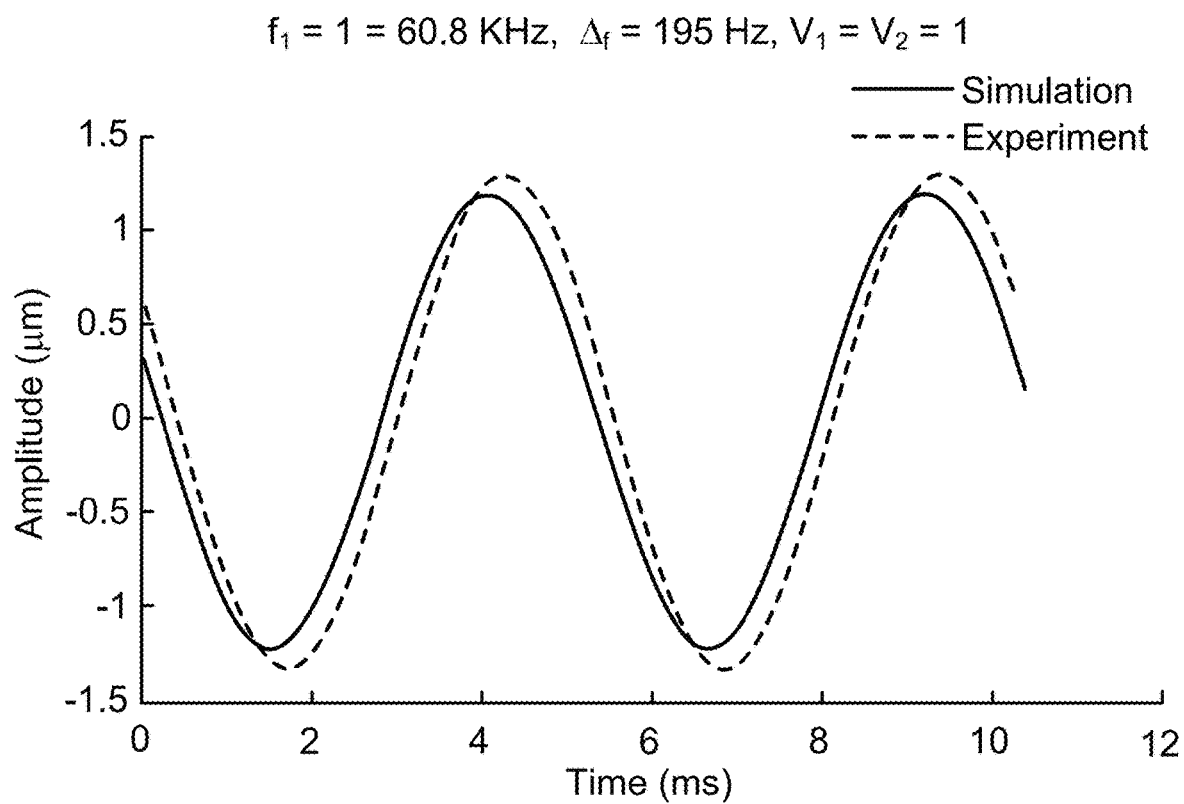
Figure 7B:
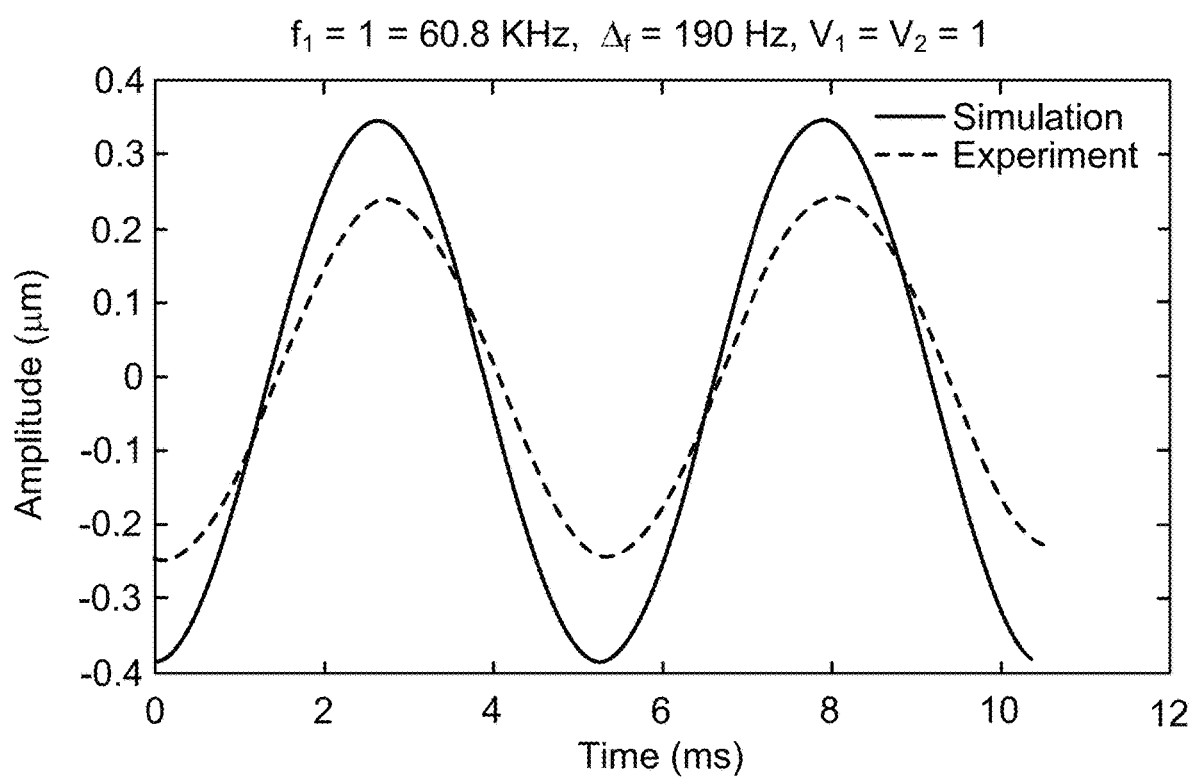

FIG. 7A shows the frequency response of the system when excited classically by a single AC source at a frequency range of (85 Hz-107.5 Hz) at 2 V. The maximum amplitude is about 0.1 μm. Experimental results are represented by circles and simulation is represented by a solid line. Also shown is the double resonance excitation using a beating signal composed of two voltage sources each with an amplitude of 1 V and a frequency of $f_1$=60.8 kHz and $f_2$=$f_1$-Δf. Experimental results are shown with crosses and simulation is shown by a dashed line. The maximum amplitude at 195 Hz is equal to 1.3 μm. An amplification of 13 times is observed in this case. Also, shown in FIG. 7B are the time histories of the vibration at 180 Hz, 190 Hz and 195 Hz, experimentally (dashed line) and theoretically (solid line).

Figure 8A:
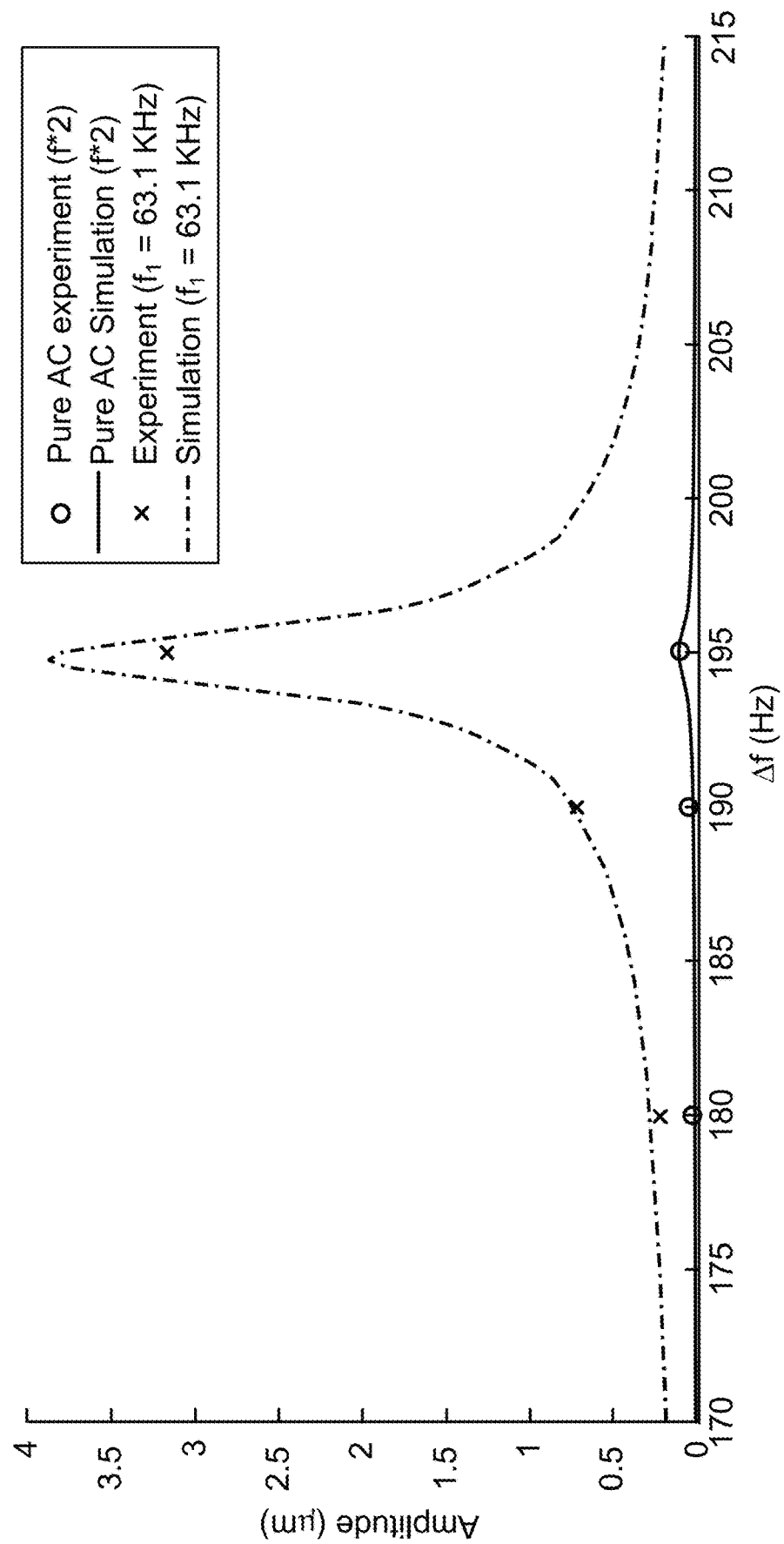
Figure 8B:
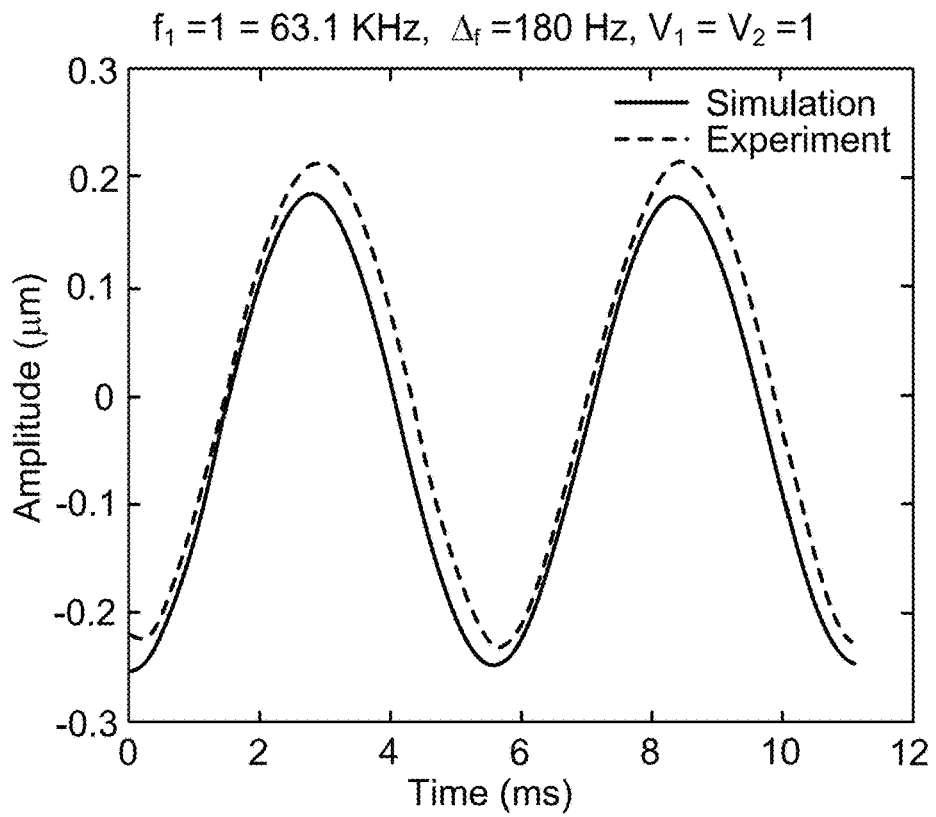
Figure 8B:
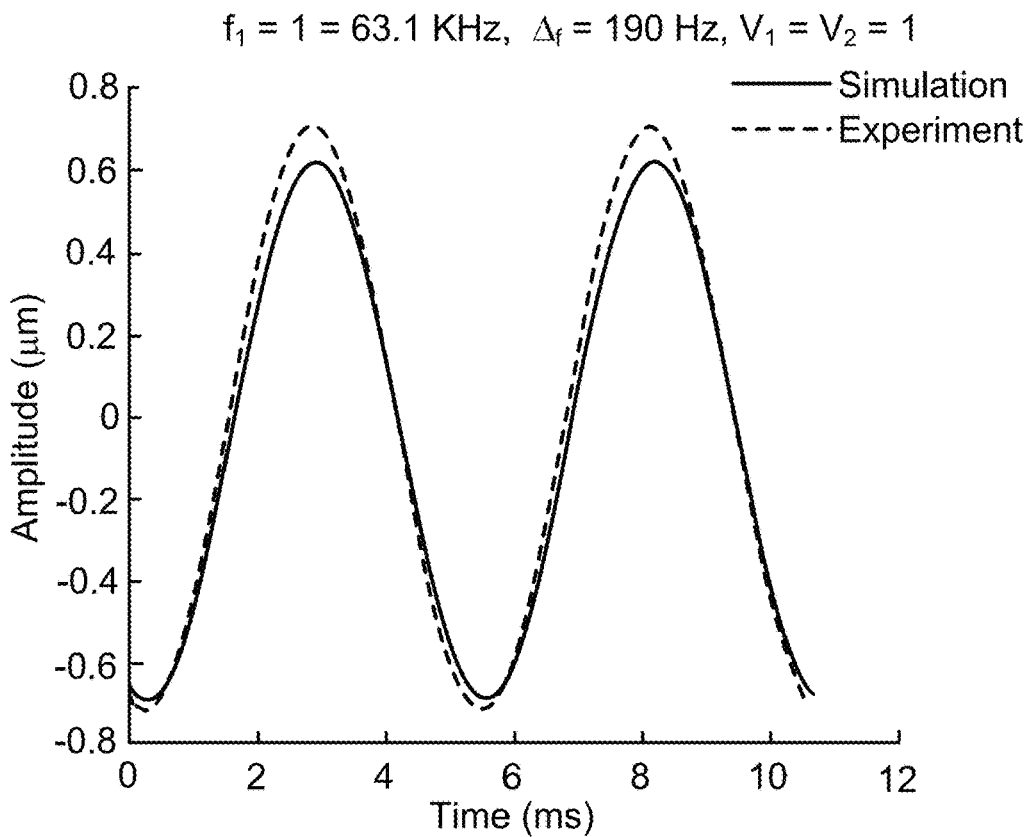
Figure 8B:
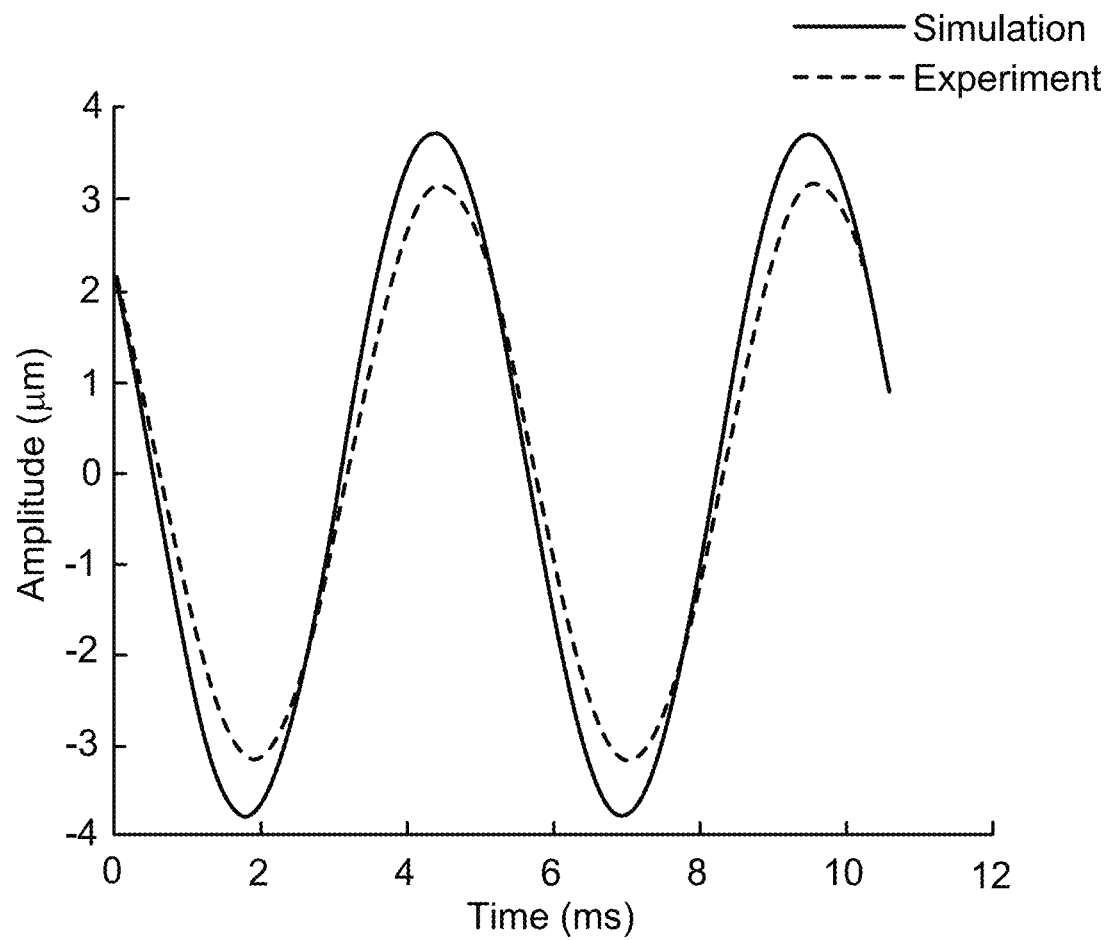

FIG. 8A shows experimental and numerical simulation frequency response when excited classically by a single AC source at a frequency range of (85 Hz-107.5 Hz) at 2 V. The maximum amplitude is about 0.1 μm. Experimental results are represented by circles and simulation is represented by a solid line. Also, shown is the double resonance excitation using a beating signal composed of two voltage sources both each with an amplitude of 1 V and a frequency of $f_1$=63.1 kHz and $f_2$=$f_1$+Δf. Experimental results are shown with crosses and simulation is shown by a dashed line. The maximum amplitude equals 3.16 μm at 195 Hz, where an amplification of 30 times is observed in this case. Also, shown in FIG. 8B are the time histories of the vibration at 180 Hz, 190 Hz and 195 Hz, experimentally (dashed line) and theoretically (solid line).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A method of actuating an electrostatic micro-electromechanical system (MEMS) micro-oscillator device, wherein the MEMS device has a natural mechanical resonance frequency and an internal electrical resonance frequency, the method comprising:
   driving the MEMS device with a first alternating current (AC) signal; and
   simultaneously driving the MEMS device with a second AC signal,
   wherein a frequency of the first AC signal is within the 3-db bandwidth of, or substantially the same as, the internal electrical resonance frequency and wherein a difference between the frequency of the first AC signal and a frequency of the second AC signal is near to or substantially the same as the natural mechanical resonance frequency.

2. The method of claim 1, wherein the MEMS oscillator device includes an electrode arrangement comprising a first electrode and a second electrode arranged parallel to the first electrode, wherein the second electrode is fixed and wherein at least a first end of the first electrode is able to move relative to the second electrode.

3. The method of claim 2, wherein the natural mechanical resonance frequency $\omega_n = \sqrt{(k/m)}$, and wherein the internal electrical resonance frequency $\omega_e = 1/\sqrt{L_s C_o}$, wherein $L_s$ is the parasitic inductance of the electrode arrangement, wherein $C_o$ is a nominal capacitance of the electrode arrangement, wherein m is an effective mass of the first electrode and wherein k is a linear stiffness of the first electrode.

4. The method of claim 2, further comprising applying a direct current (DC) signal to the first electrode.

5. A method of actuating an electrostatic micro-electromechanical system (MEMS) micro-oscillator device, wherein the MEMS device has a natural mechanical resonance frequency that is near to or substantially the same as an internal electrical resonance frequency of the MEMS device, the method comprising:
   driving the MEMS device with a first alternating current (AC) signal, wherein a frequency of the first AC signal is near to or substantially the same as the internal electrical resonance frequency or the natural mechanical resonance frequency.

6. The method of claim 5, wherein the MEMS oscillator device includes an electrode arrangement comprising a first electrode and a second electrode arranged parallel to the first electrode, wherein the second electrode is fixed and wherein at least a first end of the first electrode is able to move relative to the second electrode.

7. The method of claim 6, further comprising applying a direct current (DC) signal to the first electrode.

* * * * *